(12) United States Patent
Srivastava et al.

(10) Patent No.: US 8,291,366 B2
(45) Date of Patent: Oct. 16, 2012

(54) ROUTING SYSTEM AND METHOD USING A ROUTING TREE RIP-UP

(75) Inventors: Himanshu Srivastava, Noida (IN); Jyoti Malhotra, Haryana (IN)

(73) Assignee: STMicroelectronics PVT Ltd, Greater Noida, IN (US)

( * ) Notice: Subject to any disclaimer, the term of this patent is extended or adjusted under 35 U.S.C. 154(b) by 197 days.

(21) Appl. No.: 12/630,576

(22) Filed: Dec. 3, 2009

(65) Prior Publication Data

US 2010/0146472 A1 Jun. 10, 2010

(30) Foreign Application Priority Data

Dec. 4, 2008 (IN) .......................... 2755/DEL/2008

(51) Int. Cl.
*G06F 17/50* (2006.01)
*G06F 9/455* (2006.01)
(52) U.S. Cl. ........ 716/129; 716/126; 716/130; 716/131; 716/132
(58) Field of Classification Search .................. None
See application file for complete search history.

(56) References Cited

U.S. PATENT DOCUMENTS

| | | | | |
|---|---|---|---|---|
| 5,550,748 A | * | 8/1996 | Xiong | 716/129 |
| 5,717,600 A | * | 2/1998 | Ishizuka | 716/130 |
| 6,305,004 B1 | * | 10/2001 | Tellez et al. | 716/129 |
| 7,013,451 B1 | * | 3/2006 | Teig et al. | 716/129 |
| 7,111,268 B1 | * | 9/2006 | Anderson et al. | 716/113 |
| 7,134,112 B1 | * | 11/2006 | Anderson et al. | 716/113 |
| 7,571,411 B2 | * | 8/2009 | Hentschke et al. | 716/126 |
| 7,853,915 B2 | * | 12/2010 | Saxena et al. | 716/129 |
| 2007/0159984 A1 | * | 7/2007 | Hentschke et al. | 370/254 |
| 2008/0170514 A1 | * | 7/2008 | Hentschke et al. | 370/256 |

OTHER PUBLICATIONS

Cormen, Thomas H. et al., "Introduction to Algorithms, Second Edition", The MIT Press, McGraw-Hill Book Company, 2001, pp. 595-601.
Dijkstra, E.W., "A Note on Two Problems in Connexion with Graphs", Numerische Mathematik 1, pp. 269-271, 1959.

* cited by examiner

*Primary Examiner* — Leigh Garbowski
*Assistant Examiner* — A. M. Thompson
(74) *Attorney, Agent, or Firm* — Gardere Wynne Sewell LLP

(57) ABSTRACT

A routing system is improved by performing three steps sequentially to complete an execution process. The first step estimates a normalized criticality score for each design net. The second step arranges the scores for each design net in descending order. Third step rips up and reroutes the design so as to make it more feasible.

22 Claims, 4 Drawing Sheets

ROUTING SYSTEM AND METHOD USING A ROUTING TREE RIP-UP

PRIORITY CLAIM

This application claims priority to Indian Provisional Application for Patent No. 2755/Del/2008 filed Dec. 4, 2008, the disclosure of which is hereby incorporated by reference.

TECHNICAL FIELD

The present disclosure relates to computer-aided designs (CAD), and more specifically, to an improved routing system in an integrated circuits.

BACKGROUND

Routing is executed on various kinds of networks, including the telephone networks, electronic networks and transportation (transport) networks. The main rationale while performing routing involves selecting paths in the network along which information has to be transported based on parameters such as timing delay, unrouted routes, number of hops (intermediate points) and transmission cost.

Routing in large integrated circuits or electronic networks is automatically performed by a routing mechanism known as a "router" that is typically implemented as a software tool on a computer-aided design system (CAD).

In CAD, modern routers try to find routing paths through the routing resource graph. These routers primarily consider the cost of various routing alternatives available in the resource graph as a step prior to routing. Each routing alternative available in the resource graph comprises nets which further comprise a combination of sources and sinks.

Further, static cost and dynamic cost are the main attributes in determining cost of the nets. The static cost for a given net comprises those attributes which do not change across routing iterations. They are further divided into three parameters:

a) a net's span, is the span of the bounding box (a rectilinear region) of the net in x and y directions. A wider span indicates that the pins (sinks) of the net are apart and gives good approximation of total wirelength required to route this net. The wider the span, the higher the chance of a net being un-routable.

FIG. 1 illustrates a net bounding box, X units wide and Y units apart. The half perimeter of the bounding box is approximated by $HPWL=X+Y$ b) a net's fan-out, is the number of sinks that the source of the net drives. A higher value of fanout of a net uses longer segments to route the net.

Net fan-out=Number of sinks c) delay sensitivity is the change in the Manhattan distance. It is approximated by considering the change for a given $\Delta X$ and $\Delta Y$ Manhattan distance in a given bounding box. For all possible $(\Delta X, \Delta Y)$ pairs, a delay look up table is computed which stores the best routing delay possible for the corresponding Manhattan pair.

Delay sensitivity (net$_i$)=Delay value from timing look up table corresponding to ($\Delta X$, $\Delta Y$) pair as computed from the net's bounding box.

The dynamic cost of the nets comprises attributes which change across routing iterations such as number of unroutable sinks, timing deviation and wire length deviation. The attributes are defined in the following description.

i) unroutable sinks are the number of sinks of a net for which a feasible routing tree cannot be constructed.

ii) timing deviation, is the deviation from the best estimated delay possible (from the timing look up table) and the actual achieved delay.

Timing deviation=|Delay sensitivity−Actual Delay achieved| iii) wire-length deviation, is the deviation from the best estimated routed wire-length possible (from the net's placement bounding box) and the actual achieved routed wire-length (from the net's routing tree bounding box)

Wire-length deviation=|HPWL (Placement)−HPWL (Routing tree)|

Further, in the course of routing design nets it is difficult to obtain feasible routing trees. This is because of potential routing resources locked by other nets or timing/wire-length constraints of nets exceeding the desired cut off region. Under such circumstances routers proceed to a rip-up and reroute phase. Normally, the entire design is ripped up and rerouted with no intelligence in identifying sets of nets whose rip-up and reroute will make the design feasible.

SUMMARY

The present disclosure describes an improved rip-up system implemented through a computer-aided-design. This system primarily performs three steps. The first step is to estimate the normalized criticality score for each design net. The second step is to arrange the score of each design net in descending order. The third step is to rip up the critical and obstructing design nets in the design.

According to the present disclosure, a system comprises a routing module for computer aided design, said routing module comprising: a routing order estimating module; and a rip-up module.

According to another embodiment of the present disclosure the routing order estimating module comprises: a routing net normalizer; and a routing net sequencer. This routing net normalizer generates a criticality score by summation of weights of parameters of Static and Dynamic cost of the nets. The estimation of routing order comprises: approximating a normalized criticality score of each net in the design; and sequencing said normalized criticality scores in their descending order According to another embodiment of the present disclosure the rip up module comprises: a bounding box identifier; an obstructing net analyzer; and an obstructing net eliminator. The ripping up of the most critical and obstructing net sets in the design follows the steps: identifying the bounding box region and overlapping bounding box region; determining the obstructing net sets in said bounding box region; and ripping up said obstructing net sets in the design based on incremental rip up limited by a depth factor.

According to another embodiment of the present disclosure, a routing method for computer-aided design comprises: estimating routing order for all nets in the design; and ripping up the most critical and obstructing net sets in the design. The method for estimating routing order comprises: approximating a normalized criticality score of each net in the design; and sequencing said normalized criticality scores in their descending order. Further, ripping up the most critical and obstructing net sets in the design follows the steps of: identifying the bounding box region and overlapping bounding box region; determining the obstructing net sets in said bounding box region; and ripping up said obstructing net sets in the design based on incremental rip up limited by a depth factor.

BRIEF DESCRIPTION OF THE DRAWINGS

The present disclosure explains the various embodiments to the instant disclosure in the following description, taken in conjunction with the accompanying drawings, wherein.

DETAILED DESCRIPTION OF THE DRAWINGS

The embodiments of the present disclosure will be described in detail with reference to the accompanying drawings. However, the present disclosure is not limited to the embodiments described herein. The disclosure is described with reference to specific circuits, block diagrams, signals, etc. simply to provide a more thorough understanding of the disclosure.

Figure 1:
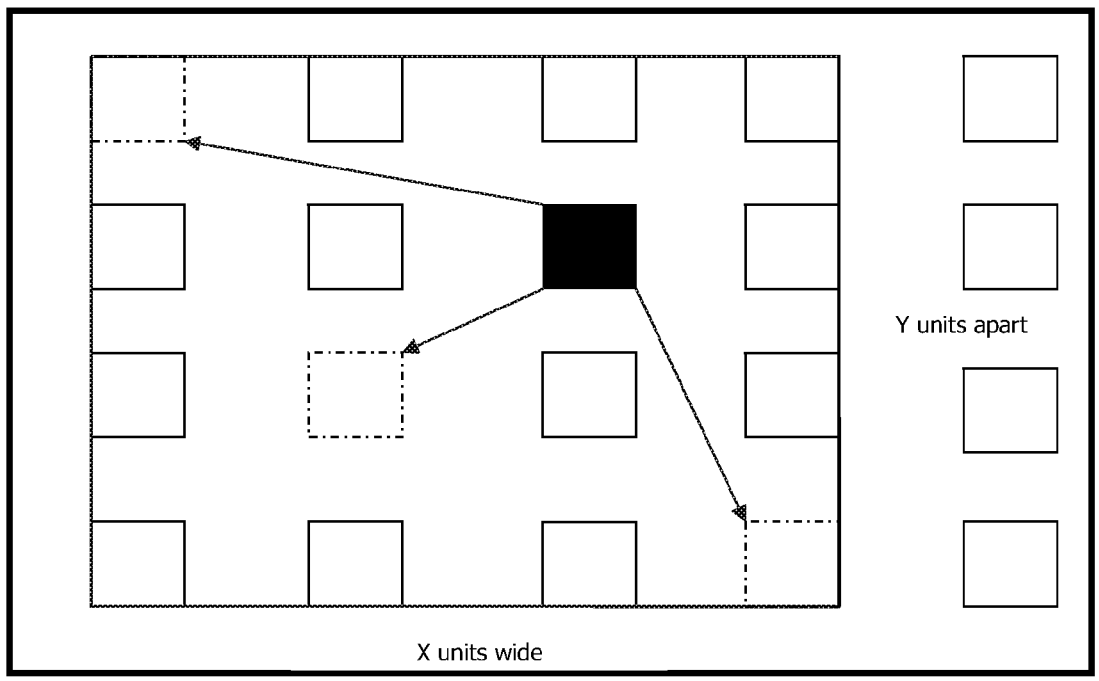
FIG. 1 illustrates a net bounding box with half perimeter length according to conventional art.
Figure 2:
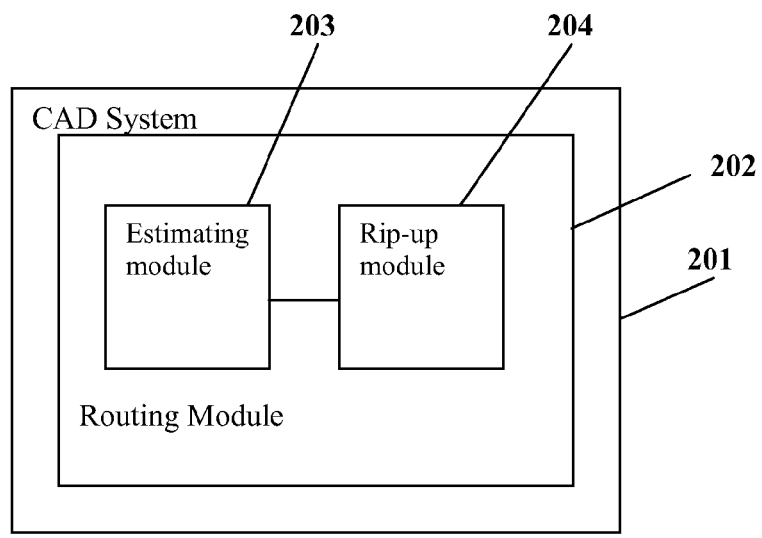
FIG. 2 illustrates overlapped nets on FPGA chip architecture according to an embodiment of the present disclosure.

FIG. 2 illustrates a block diagram of a routing module in a computer-aided-design system according to the present disclosure. A computer-aided-design system 201 comprises of a routing module 202. This routing module 202 further comprises a routing order estimating module 203 and a rip-up module 204.

Figure 3:
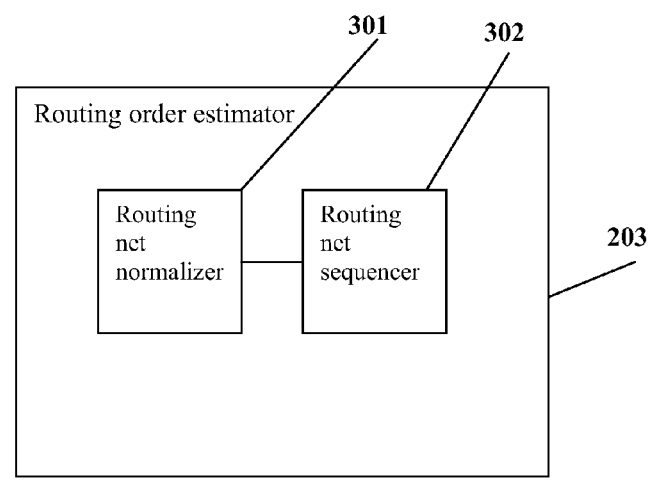
FIG. 3 illustrates a block diagram of a routing module in a computer-aided-design system according the present disclosure.

FIG. 3 illustrates a block diagram of a routing order estimating module according to the present disclosure. The routing order estimating module 203 estimates the routing order for all nets in the design. It consists of a routing net normalizer 301 for approximating a normalized criticality score of each net in the design and a routing net sequencer 302 for sequencing said normalized criticality scores in their descending order.

Further, in accordance with the present disclosure to estimate the normalized criticality score of all nets in the design, the normalized weight value of all the parameters of static and dynamic cost are computed in the following manner:

The normalized weight value span of a net is computed by normalizing half perimeter wirelength (HPWL) of each net with sum of horizontal Nx and vertical Ny chip dimension, $$\text{Weight\_Span}(net_i) = HPWL(net_i)/(Nx+Ny)$$

The normalized weight value of the fanout of a net is computed by normalizing fanout for each net with the maximum net fanout of the chip design $$\text{Weight\_Fanout}(net_i) = \text{fan-out}(net_i)/\text{Max\_design\_fan-out}$$

The normalized value for delay sensitivity is computed by normalizing delay sensitivity of each net with the critical path delay computed for the placed and routed design.

$$\text{Weight\_Delay Sensitivity}(net_i) = \text{Delay sensitivity}(net_i)/Dmax$$

Routing resource competition is another parameter of static cost in addition to Net Span and Net fan out. It is feasible for the router to find the routing tree within the bounding box as derived from the placement of the net. But due to the overlapping nature of design nets in the given bounding box, the degree of routing becomes tough.

Figure 4:
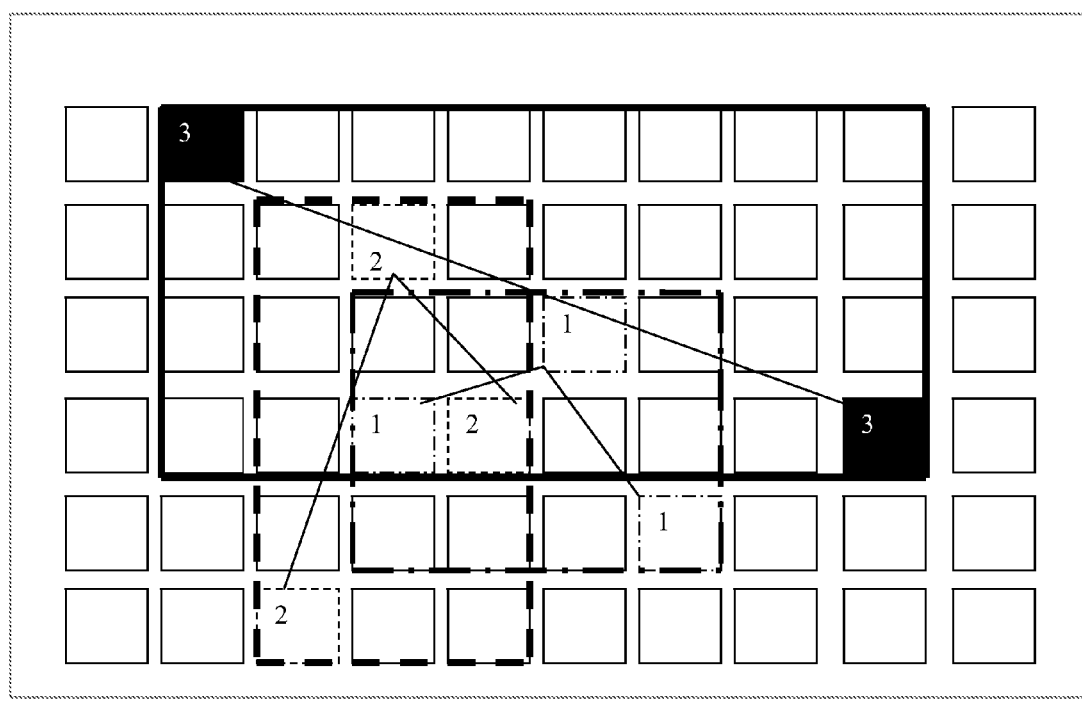
FIG. 4 illustrates a block diagram of a routing order estimating module according the present disclosure.

FIG. 4 describes the routing resource competition. The net having source sinks in blocks marked as "1" has competition with nets marked as "2" and "3". This is because the bounding box of design net "1" is overlapped by the bounding box of design "2". Further, bounding box of design net "1" and "2" are overlapped by the bounding box of design net "3" design net. This overlapping of bounding boxes create competition among the routing resources in the overlapped region. Thus, it becomes necessary to identify the criticality of design nets and avoid competition in routing. The value of the resource routing competition is approximated by:

Resource Competition (Net1)=(Routing area overlapped/Available routing area)

where,

Routing area overlapped=$\Sigma$ overlapped bounding box area (neti)

Available routing area=Bounding box of net under consideration

And, the normalized weight value of resource competition is computed by normalizing the resource competition of each net with the maximum value of the resource competition computed as follows:

$$\text{Weight\_ResourceCompetiton}(net_i) = \text{Resource\_Competition}(neti)/\text{Max\_Design\_Resource\_competition}$$

Similarly, the normalized weight values of parameters of dynamic cost are approximated in the following description.

The normalized value of unroutable nets is computed by normalizing unroutable factor of each net with the maximum net fanout in the design.

$$\text{Weight\_Unroutable}(net_i) = \text{un-routable sinks}(net_i)/\text{Max\_design\_fan-out}$$

The normalized value of Timing Deviation is computed by normalizing timing deviation for each net with the critical path delay computed for the placed and routed design.

$$\text{Weight\_Timing\_Deviation}(net_i) = \text{Timing deviation}(net_i)/Dmax$$

And, the normalized value of Wire-length Deviation is computed by normalizing Wirelength deviation for each net with sum of Horizontal (Nx) and vertical (Ny) chip dimensions.

$$\text{Weight\_Wire\_Deviation}(net_i) = \text{Wire-length deviation}(net_i)/(Nx+Ny)$$

After computing the normalized weight values of each static and dynamic cost parameter, the total criticality of each net is given by adding all the computed normalized weights of each parameter. The score is approximated by Criticality_Score$(net_i)_{normalized}$, wherein:

$$\text{Criticality\_Score}(net_i)_{normalized} = \text{Weight\_Span}(net_i) + \text{Weight\_Fanout}(net_i) + \text{Weight\_ResourceCompetiton}(net_i) + \text{Weight\_Delay Sensitivity}(net_i) + \text{Weight\_Unroutable}(net_i) + \text{Weight\_Timing\_Deviation}(net_i) + \text{Weight\_Wire\_Deviation}(net_i)$$

Further, the routing net sequencer 302 arranges the normalized criticality score value approximated by the routing net normalizer 301, in decreasing order of their criticality. This arrangement of scores gives the approximated order of the critical nets prior to routing. This pre-estimation of routing order not only helps in achieving a high quality routed solution but also increases the routability prospects.

After defining the order of design nets, in another aspect of the present disclosure the critical nets are removed in the routing process by means of an intelligent rip up algorithm.

Figure 5:
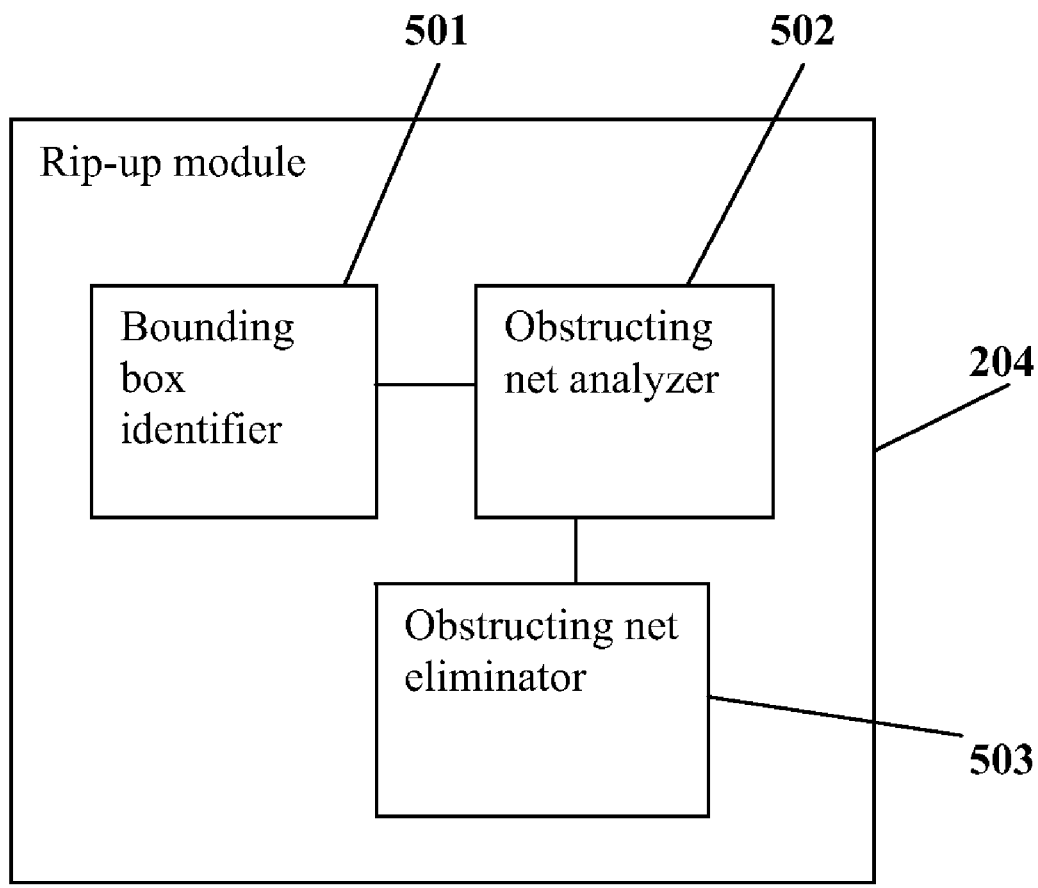
FIG. 5 illustrates a block diagram of a rip-up module according the present disclosure.

FIG. 5 illustrates a block diagram of the rip-up module according to an embodiment of the present disclosure. The rip-up module 204 rips up the most critical and obstructing net sets in the routing design. The rip-up module 204 comprises: a bounding box identifier 501, for identifying bounding box region and overlapping bounding box region; an obstructing net analyzer 502, for determining the obstructing net sets in said bounding box region; and an obstructing net eliminator 503, for ripping up said obstructing net sets in the design.

Hereinafter, critical nets are referred as obstructing net sets. These obstructing net sets are overlapping bounding boxes i.e. a net whose routing tree passes through the given net's routing tree region and creates obstruction for the other. Therefore, overlapping between these boxes has to be removed for a feasible routing solution. The following pseudo code shows the implementation of the rip-up algorithm:

```
RipUpAlgorithm(list<int> badNets)
{
    for_each(net ∈ badNets)
    {
        Let netID be ID of net
        List<int>ObstructingNetSet = Incremental_Rip_up(netID, 0)
        For_each(net ∈ ObstructingNetSet)
        {
            Release routing tree of net
        }
    }
}
```

Further, the function Incremental_Rip_up takes into account the parameter known as "depth Factor". Depth factor is an absolute value of recursion reached (for a particular obstructing net ripup) at any given instance of time and is a variable which gets incremented by one during each recursive rip up call for an obstructing net till the list is completed. It is computed during experimentation by repetitive simulation. The following pseudo code shows the ripping up the design considering the depth factor:

```
List<int> Incremental_Rip_up(int netID, int depthFactor)
{
    If (depthFactor == desiredDepthFactor)
    {
        Return
    }
    depthFactor ++;
}
```

According to the algorithm, rip-up begins with ripping the routing trees with bad nets (timing or wire length constraints) within each bounding box of the design net. If the process is successful then the execution gets completed otherwise it returns back to the bounding box of design net as given by its placement. The following pseudo code explains the computation of the bounding box and the routing tree:

```
boundingBox = computeBoundingBox(netID)
list<int> obstructingNetSet = computeOverlappingNets(netID)
    for_each(net ∈ obstructingNetSet)
```

```
    {
        List<int> recursiveNet = Incremental_Rip_up(net, depthFactor)
        Populate obstructingNetSet with recursiveNet
    }
    Populate obstructingNetSet with netID
    Return obstructingNetSet
}
BoundingBox computeBoundingBox(int netID)
{
    Let designNet be the net corresponding to netID
    If (routing tree of designNet exists)
    {
        Return bounding box of designNet's routing tree
    }
    Else
    {
        Return bounding box of designNet as given by its placement
    }
}
```

Further, the obstructing net set is determined by computing overlapping nets of the overlapping bounding boxes in the following pseudo codes as explained in the subsequent lines:

```
List <int> computeOverlappingNets(int netID)
{
    List<int> overlappedNets
    Let designNet be the net corresponding to netID
    For_each (net (candidateNet) of design)
    {
        Let boundingBox1 be bounding box of routing tree for designNet
        Let boundingBox2 be bounding box of routing tree for candidateNet
        If (boundingBox2 overlaps complete or partially boundingBox1)
        {
            Populate overlappedNets with candidateNet's ID
        }
    }
    Return overlappedNets
}
```

Figure 6:
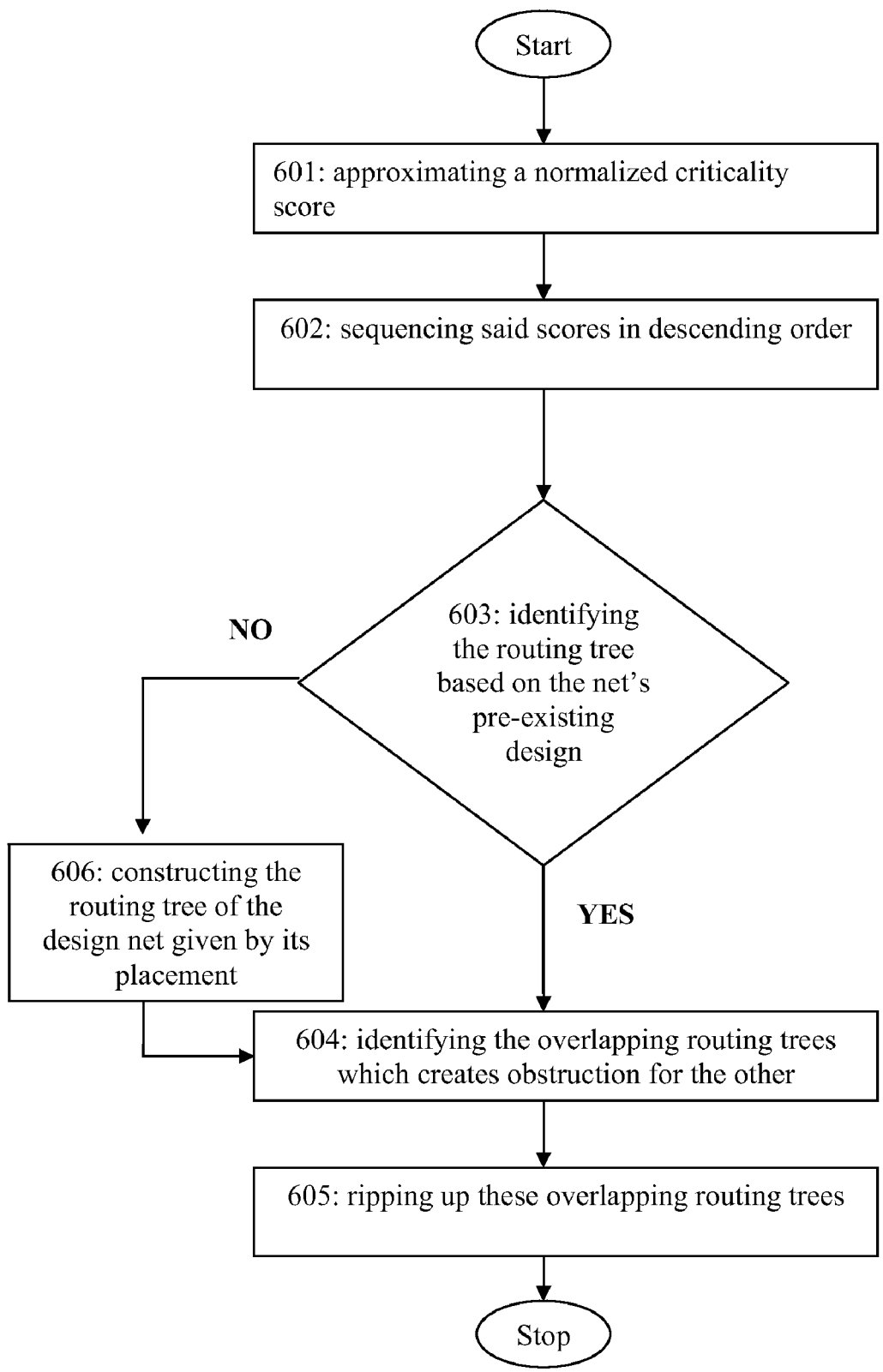
FIG. 6 illustrates a flow chart for a method for rip-up routing according to an embodiment of the present disclosure.

An embodiment describing the method for rip-up routing is described in FIG. 6. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 6 illustrates a flowchart for a method for rip-up routing according to an embodiment of the present disclosure. In step 601, a normalized criticality score is approximated for each net in the design by the routing net normalizer 301. In step 602 the said scores are sequenced in the descending order of their values by the routing net sequencer 302. In step 603, an identification is made of the routing tree based on the net's preexisting design. If the identification cannot be made in step 603, then in step 606 the routing tree is constructed.

Further, in step 604 the obstructing net analyzer 502 identifies the overlapping routing tree which creates obstruction for the other. In step 605, obstructing net sets are ripped up by the rip-up module 204.

Thus, the intelligent rip up algorithm rips up bad nets as well as obstructing net sets while maintaining the good nets available in the design. This reduces the processing time of the system, thus making it fast and accurate.

The embodiment of the present disclosure can be used in various applications for finding shortest path routes in FPGA chip architectures, Communication networks, Traffic Information systems etc.

Although the disclosure of the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. Aspects of the embodiments can be modified, if necessary to employ concepts of the known prior art to provide yet further embodiments. These and other changes can be made to the embodiments in light of the above-detailed description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A routing method for computer-aided design comprising:
   estimating with a computer aided design system a routing order for all nets in a design; and
   ripping up with a computer aided design system most critical and obstructing net sets in the design;
   wherein ripping up the most critical and obstructing net sets in the design comprises:
      identifying with a bounding box identifier of the second module a bounding box region and overlapping bounding box region;
      determining with an obstructing net analyzer of the second module a list of obstructing net sets in said bounding box region; and
      ripping up with an obstructing net eliminator of the second module said obstructing net sets; and
   wherein obstructing net sets are ripped up by incremental rip up limited by a depth factor that is an absolute value of recursion reached at any given instance of time and which is a variable that is incremented by one during each recursive rip up call for an obstructing net until the list is completed.

2. The method of claim 1, wherein estimating the routing order comprises:
   approximating with a normalizer of the first module a normalized criticality score of each net in the design; and
   sequencing with a sequencer of the first module said normalized criticality scores in descending order.

3. The method of claim 2, wherein approximating the normalized criticality score comprises summing of weights of parameters of static cost and dynamic cost of the net.

4. The method of claim 1, wherein identifying the bounding box region comprises:
   identifying a routing tree of an existing design net.

5. The method of claim 1, wherein the overlapping bounding box region is determined by a net whose routing tree passes through the routing tree region of a given net and creates an obstruction.

6. A routing method for computer-aided design, comprising:
   estimating a routing order for nets in a design, said routing order identifying a criticality score for each net in the design;
   implementing routing trees for said nets in the design;
   identifying obstructing net sets comprised of nets in the design whose implemented routing trees obstruct each other; and
   ripping up the implemented routing trees for the identified obstructing net sets;
   wherein ripping up comprises performing an incremental rip up limited by a depth factor.

7. The routing method of claim 6, wherein the depth factor is an absolute value of recursion.

8. The routing method of claim 7, wherein the depth factor is a variable that is incremented by one during each recursive rip up call for an obstructing net set.

9. A routing method for computer-aided design, comprising:
   estimating a routing order for nets in a design, said routing order identifying a criticality score for each net in the design;
   implementing routing trees for said nets in the design;
   identifying obstructing net sets comprised of nets in the design whose implemented routing trees obstruct each other; and
   ripping up the implemented routing trees for the identified obstructing net sets;
   wherein ripping up comprises performing a recursive rip up of obstructing net sets, said recursive rip up limited by a depth factor.

10. The routing method of claim 9, wherein the depth factor is an absolute value of recursion.

11. The routing method of claim 10, wherein the depth factor is a variable that is incremented by one for each recursive rip up.

12. The routing method of claim 9, wherein each routing tree is a routing tree of an existing design net.

13. The routing method of claim 9, wherein each routing tree is a routing tree of a design net as given by placement.

14. A routing method for computer-aided design, comprising:
   estimating a routing order for nets in a design, said routing order identifying a criticality score for each net in the design;
   implementing routing trees for said nets in the design;
   identifying obstructing net sets comprised of nets in the design whose implemented routing trees obstruct each other; and
   ripping up the implemented routing trees for the identified obstructing net sets;
   wherein ripping up comprises:
      identifying with a bounding box identifier a bounding box region and overlapping bounding box region;
      determining a list of obstructing net sets in said bounding box region; and
      ripping up said obstructing net sets.

15. The routing method of claim 14, wherein the overlapping bounding box region is determined by a net whose routing tree passes through the routing tree region of a given net and creates an obstruction.

16. The routing method of claim 15, wherein obstructing net sets are ripped up by incremental rip up limited by a depth factor.

17. The routing method of claim 16, wherein the depth factor is an absolute value of recursion operation.

18. The routing method of claim 16, wherein the depth factor a variable that is incremented by one during each recursive rip up.

19. A routing method for computer-aided design, comprising:

estimating a routing order for nets in a design, said routing order identifying a criticality score for each net in the design;
implementing routing trees for said nets in the design;
identifying obstructing net sets comprised of nets in the design whose implemented routing trees obstruct each other; and
ripping up the implemented routing trees for the identified obstructing net sets;
wherein estimating the routing order comprises:
   approximating a normalized criticality score of each net in the design; and
   sequencing said normalized criticality scores in descending order.

20. The routing method of claim 19, wherein approximating the normalized criticality score comprises summing of weights of parameters of static cost and dynamic cost of the net.

21. A routing method for computer-aided design comprising:
estimating a routing order for nets in a design;
implementing routing trees for said nets in the design; and
ripping up the routing trees for obstructing net sets in the design;
wherein ripping up comprises performing an incremental rip up limited by a depth factor that is an absolute value of recursion and which is a variable that is incremented by one during each recursive rip up of an obstructing net set.

22. The routing method of claim 21, wherein ripping up comprises:
identifying a bounding box region and overlapping bounding box region;
determining a list of obstructing net sets in said bounding box region; and
ripping up said obstructing net sets.

* * * * *

UNITED STATES PATENT AND TRADEMARK OFFICE
CERTIFICATE OF CORRECTION

PATENT NO.        : 8,291,366 B2                                Page 1 of 1
APPLICATION NO.   : 12/630576
DATED             : October 16, 2012
INVENTOR(S)       : Himanshu Srivastava et al.

It is certified that error appears in the above-identified patent and that said Letters Patent is hereby corrected as shown below:

At column 2, line number 50, please replace "steps:" with -- steps of: --

Signed and Sealed this
Twelfth Day of February, 2013

Teresa Stanek Rea
*Acting Director of the United States Patent and Trademark Office*